(12) United States Patent
Tsai

(10) Patent No.: US 10,998,319 B1
(45) Date of Patent: May 4, 2021

(54) MEMORY STRUCTURE

(71) Applicant: NANYA TECHNOLOGY CORPORATION, New Taipei (TW)

(72) Inventor: Jhen-Yu Tsai, Kaohsiung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/799,840

(22) Filed: Feb. 25, 2020

(51) Int. Cl.
| | |
|---|---|
| *H01L 27/108* | (2006.01) |
| *G11C 11/4097* | (2006.01) |
| *G11C 5/10* | (2006.01) |
| *G11C 5/06* | (2006.01) |

(52) U.S. Cl.
CPC ........ *H01L 27/10811* (2013.01); *G11C 5/063* (2013.01); *G11C 5/10* (2013.01); *G11C 11/4097* (2013.01)

(58) Field of Classification Search
CPC .............. H01L 27/10811; G11C 5/063; G11C 11/4097; G11C 5/10
USPC .......................................................... 365/63
See application file for complete search history.

(56) References Cited

U.S. PATENT DOCUMENTS

| | | | | |
|---|---|---|---|---|
| 8,467,216 B2 * | 6/2013 | Kim | ......................... | G11C 7/02 365/63 |
| 2019/0312031 A1 * | 10/2019 | Liaw | ................... | H01L 23/5226 |
| 2020/0194435 A1 * | 6/2020 | Lilak | ................... | H01L 29/1037 |

FOREIGN PATENT DOCUMENTS

| | | |
|---|---|---|
| TW | 201304073 | 1/2013 |
| TW | 201842649 | 12/2018 |

\* cited by examiner

*Primary Examiner* — Fernando Hidalgo
(74) *Attorney, Agent, or Firm* — JCIPRNET

(57) ABSTRACT

Provided is a memory structure including a substrate having a memory region and a peripheral region, a capacitor array, a transistor array, bit lines, and contacts. The capacitor array is on the substrate in the memory region. The transistor array is on and electrically connected to the capacitor array. The bit lines are extended along a row direction in parallel with each other on the transistor array, and are electrically connected to the transistor array. Each of the contacts is connected to one of the bit lines and a conductive device at the substrate in the peripheral region. Each of the contacts includes a first portion, a second portion, and a third portion. The second portion is between the first portion and the third portion. The third portion is electrically connected to the conductive device. Distances between each of the third portions and the memory region are the same.

9 Claims, 3 Drawing Sheets

MEMORY STRUCTURE

BACKGROUND OF THE INVENTION

1. Field of the Invention

The invention relates to a semiconductor structure, and in particular, to a memory structure.

2. Description of Related Art

Currently, a memory structure including a transistor and a capacitor is developed. In such a memory structure, the capacitor is used as a storage device. Under the current trend of increasing a device integration degree, how to effectively improve electrical performance of a device of a memory without increasing a size of a memory cell is a current goal of the industry with ongoing efforts. In the current technology, a vertical transistor may replace a horizontal transistor to save a layout area of the memory cell and increase the device integration degree.

SUMMARY OF THE INVENTION

The invention provides a memory structure having a vertical transistor.

The memory structure of the invention includes a substrate having a memory region and a peripheral region, a capacitor array, a transistor array, a plurality of bit lines, and a plurality of contacts. The capacitor array is disposed on the substrate in the memory region. The transistor array is disposed on and electrically connected to the capacitor array. The plurality of bit lines are extended along a row direction in parallel with each other on the transistor array, and are electrically connected to the transistor array. Each of the contacts is connected to one of the plurality of bit lines and a conductive device at the substrate in the peripheral region. Each of the contacts includes first portions, second portions, and third portions. The second portion is disposed between the first portion and the third portion, and the third portion is electrically connected to the conductive device. Distances between each of the third portions and the memory region are the same.

In one embodiment of the memory structure of the invention, the plurality of bit lines are extended into the peripheral region.

In one embodiment of the memory structure of the invention, second portions of the contacts connected to the bit lines in an odd row are aligned with each other in a column direction interlaced with the row direction, second portions of the contacts connected to the bit lines in an even row are aligned with each other in the column direction, and the second portions in the odd row and the second portions in the even row are misaligned with each other in the column direction.

In one embodiment of the memory structure of the invention, distances between the second portions of the contacts connected to the bit lines in an odd row and the memory region are the same.

In one embodiment of the memory structure of the invention, distances between the second portions of the contacts connected to the bit lines in an even row and the memory region are the same.

In one embodiment of the memory structure of the invention, the third portions of each of the contacts are aligned with each other in a column direction interlaced with the row direction.

In one embodiment of the memory structure of the invention, in a top view, a projection area of the second portion on the substrate is greater than a projection area of the third portion on the substrate.

In one embodiment of the memory structure of the invention, in a top view, a projection area of the first portion on the substrate is less than a projection area of the second portion on the substrate.

In one embodiment of the memory structure of the invention, in a top view, a projection area of the first portion on the substrate is less than a projection area of the third portion on the substrate.

In one embodiment of the memory structure of the invention, the conductive device includes a sense amplifier.

Based on the above, in these contacts connecting the bit lines and the conductive device at the substrate in the peripheral region, the distances between the third portions connected to the conductive device and the memory region are the same, so that the conductive device may receive a same electric signal through these third portions.

To make the features and advantages of the invention clear and easy to understand, the following gives a detailed description of embodiments with reference to accompanying drawings.

DESCRIPTION OF THE EMBODIMENTS

The following makes detailed description by listing embodiments and with reference to accompanying drawings, but the provided embodiments are not intended to limit the scope covered by the present invention. In addition, the drawings are drawn only for the purpose of description, and are not drawn according to original sizes. For ease of understanding, same elements in the following description are described by using same signs.

Terms such as "includes", "comprises", and "having" used herein are all inclusive terms, namely, mean "includes but not limited to".

In addition, the directional terms mentioned herein, like "above" and "below", are only used to refer to the directions in the accompanying drawings and are not intended to limit the invention.

Figure 1:
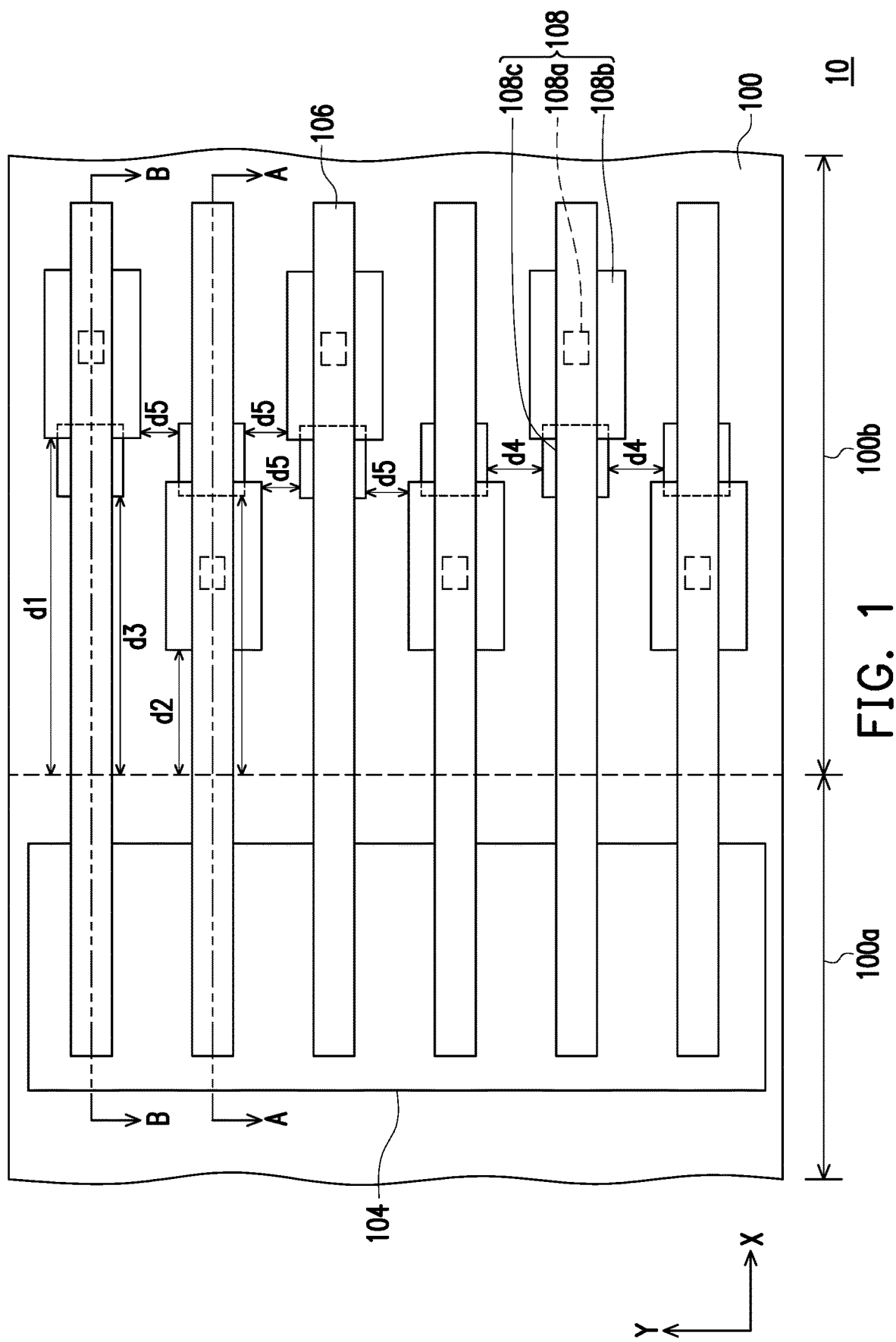
FIG. 1 is a schematic top view of a memory structure according to an embodiment of the invention.
Figure 2A:
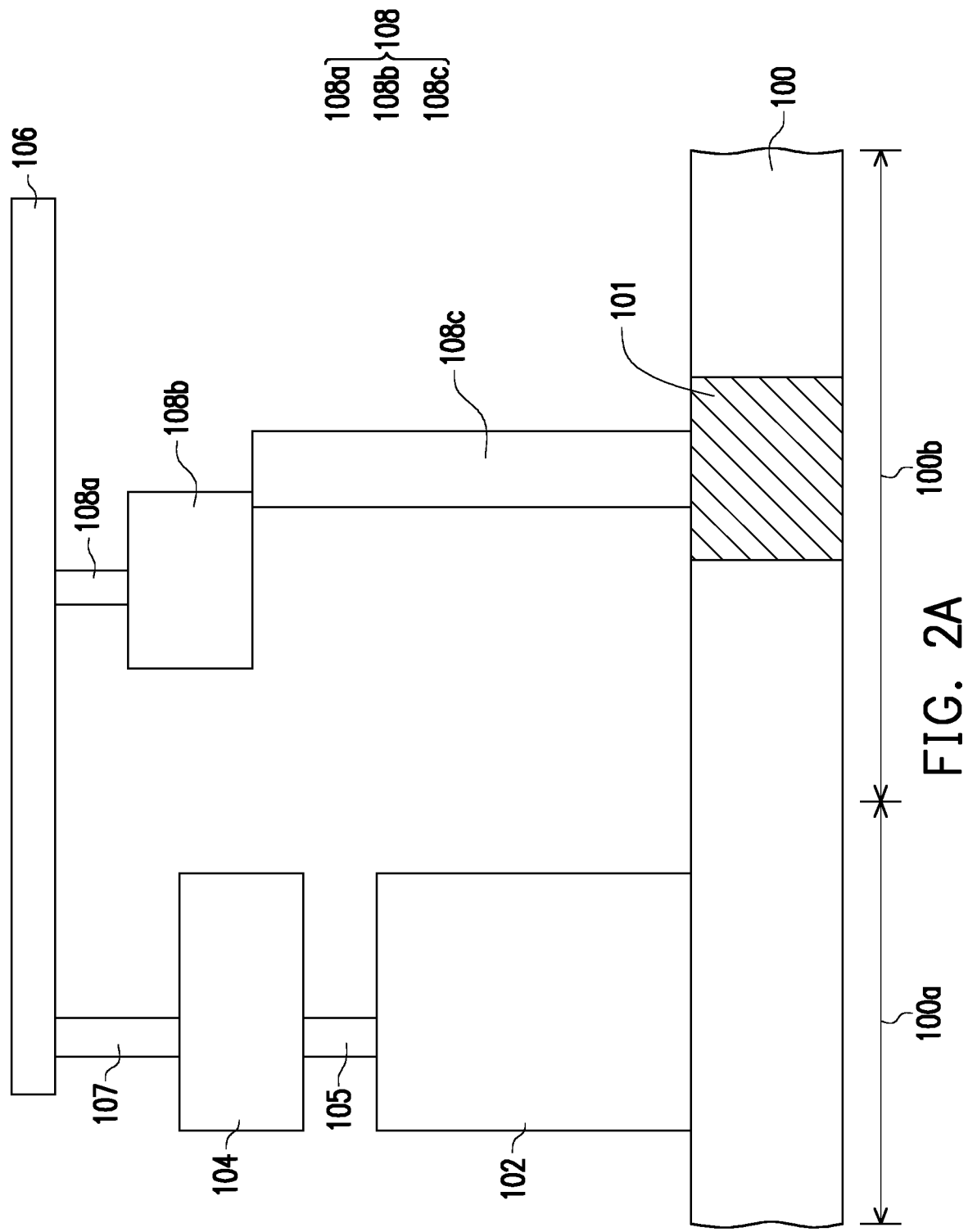
FIG. 2A is a schematic cross-sectional view taken along line A-A in FIG. 1.
Figure 2B:
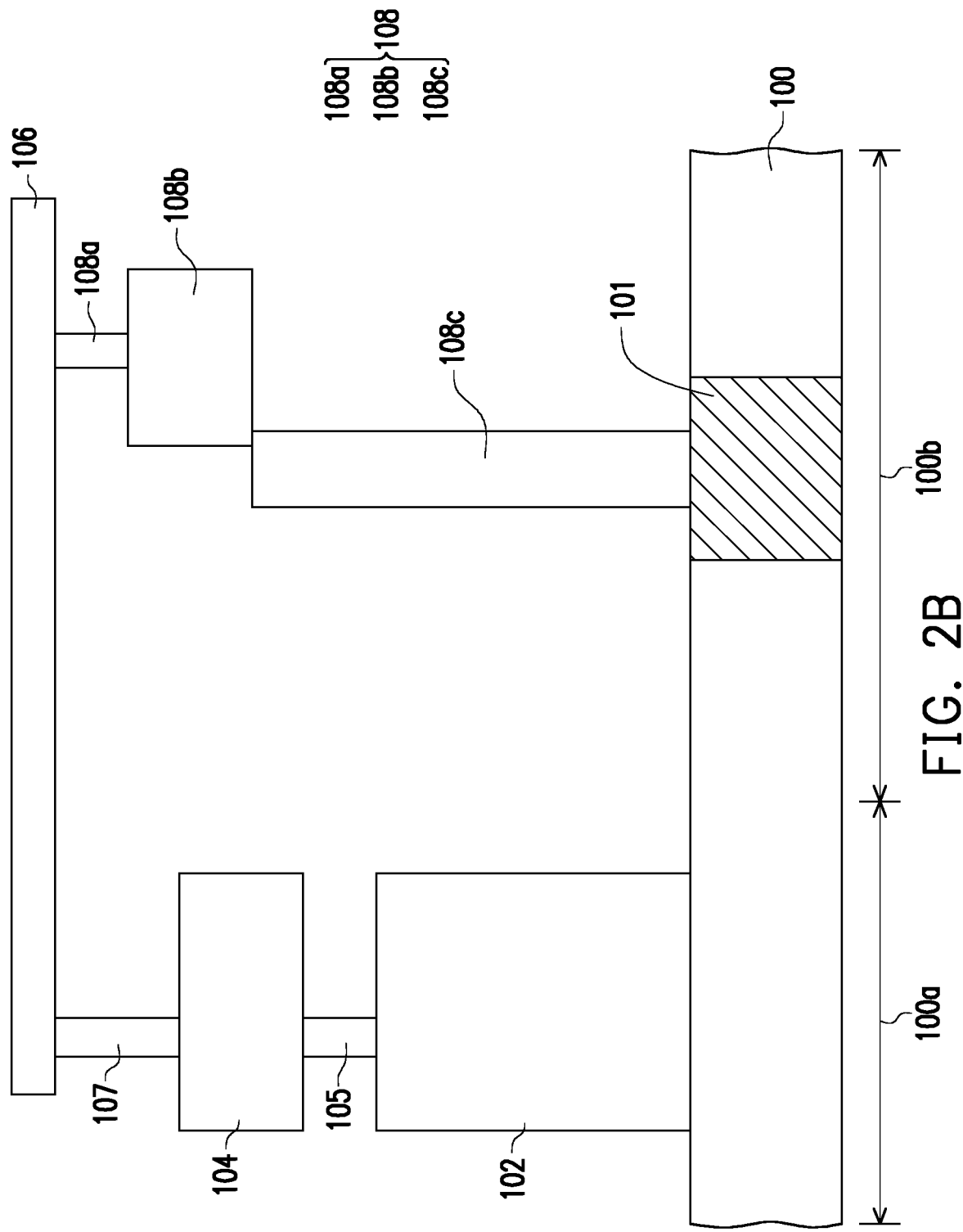
FIG. 2B is a schematic cross-sectional view taken along line B-B in FIG. 1.

FIG. 1 is a schematic top view of a memory structure according to an embodiment of the invention. FIG. 2A is a schematic cross-sectional view taken along line A-A in FIG. 1. FIG. 2B is a schematic cross-sectional view taken along line B-B in FIG. 1.

Referring to FIG. 1, FIG. 2A, and FIG. 2B, a memory structure 10 of the present embodiment includes a substrate 100, a capacitor array 102, a transistor array 104, bit lines 106, and contacts 108. In FIG. 1, FIG. 2A, and FIG. 2B, in order to make the illustration clear and for convenience of description, a dielectric layer formed on the substrate 100 and covering the memory structure 10 is omitted. In addition, the invention does not limit actual structures of the capacitor array 102 and the transistor array 104, that is, the invention is applicable to any kind of capacitor array and transistor array. Therefore, detailed structures of the capacitor array 102 and the transistor array 104 are not shown in FIG. 1, FIG. 2A, and FIG. 2B, and a block diagram is used as an example. Therefore, those skilled in the art may clearly understand the capacitor array 102 and the transistor array 104 in the present embodiment.

The substrate 100 includes a memory region 100a and a peripheral region 100b. The substrate 100 is, for example, a dielectric layer disposed on a silicon substrate, and a conductive device 101 is disposed at the substrate 100 in the peripheral region 100b. In the present embodiment, the conductive device 101 is disposed at the substrate 100 in the peripheral region 100b, and the conductive device 101 is, for example, a sense amplifier configured to receive an electric signal from the memory region 100a, but the invention is not limited thereto. In FIG. 1, FIG. 2A, and FIG. 2B, in order to make the illustration clear and for convenience of description, an actual structure of the conductive device 101 is not shown.

The capacitor array 102 is disposed on the substrate 100 in the memory region 100a. The capacitor array 102 includes a plurality of capacitors (not shown) arranged in an array, and these capacitors are, for example, vertical capacitors having a large depth-to-width ratio, but the invention is not limited thereto. In addition, the transistor array 104 is disposed on the capacitor array 102, and electrically connected to the capacitor array 102 via the contact 105. The transistor array 104 includes a plurality of transistors (not shown) arranged in an array, and the quantity of transistors may correspond to the quantity of capacitors according to actual design. In FIG. 2A, for the purpose of illustration, only one contact 105 connecting the capacitor array 102 and the transistor array 104 is shown. However, those skilled in the art should understand that in an actual architecture, the appropriate quantity of contacts may be disposed between each transistor and the corresponding capacitor.

A plurality of bit lines 106 are extended along a row direction (in a direction X in FIG. 1), and are disposed on the transistor array 104 in parallel with each other. These bit lines 106 are electrically connected to the transistor array 104 through the contacts 107. In FIG. 1, for the purpose of illustration, only six bit lines 106 are shown, but those skilled in the art should understand that the quantity of the bit lines 106 may depend on the quantity of transistors in the transistor array 104 in the actual architecture. In the present embodiment, the bit lines 106 are extended from the memory region 100a to the peripheral region 100b, but the invention is not limited thereto. In other embodiments, an end of the bit line 106 may be located at a boundary between the memory region 100a and the peripheral region 100b, or located in the memory region 100a.

In order to transmit the electric signal of the memory region 100a to the conductive device 101 (such as a sense amplifier) in the peripheral area 100b via the bit line 106, each bit line 106 is electrically connected to the conductive device 101 via the contacts 108 disposed between the bit line 106 and the conductive device 101. With the increasing integration of semiconductor devices and miniaturization of device sizes, in adjacent two rows, parasitic capacitance is often inevitably generated between the contacts connecting the bit lines and the conductive device. In addition, in order to increase capacitance, capacitors in the capacitor array 104 usually have a high aspect ratio, so that the contact connecting the bit line to the conductive device also has a high aspect ratio, and therefore the contact connecting the bit lines and the conductive device has an excessively high resistance value. Affected by the foregoing parasitic capacitance and the high resistance value, the conductive device 101 (for example, the sense amplifier) in the peripheral region 100b will not be able to receive an accurate electric signal. Therefore, in the present embodiment, the contacts 108 connecting the bit lines 106 and the conductive device 101 are divided into three parts to minimize the influence of the foregoing parasitic capacitance and high resistance. Detailed description is given below.

In the present embodiment, each contact 108 includes a first portion 108a, a second portion 108b, and a third portion 108c. The second portion 108b is disposed between the first portion 108a and the third portion 108c, and connects the first portion 108a and the third portion 108c. In the present embodiment, the first portion 108a of the contact 108 is connected to the bit line 106, and the third portion 108c of the contact 108 is connected to the conductive device 101. In addition, in a top view (as shown in FIG. 1), in order to connect to the bit line 106, the first portion 108a usually has a smaller width. In other words, in the present embodiment, a projection area of the first portion 108a on the substrate 100 is less than a projection area of the second portion 108b on the substrate 100, and is less than a projection area of the third portion 108c on the substrate 100.

In addition, in order to reduce the resistance value of the contact 108, in the present embodiment, in comparison to the first portion 108a and the third portion 108c, the second portion 108b has a largest width. In other words, in the present embodiment, a projection area of the second portion 108b on the substrate 100 is greater than a projection area of the third portion 108c on the substrate 100. In addition, in order to reduce the parasitic capacitance generated between the contacts in two adjacent rows, in comparison to the first portion 108a and the second portion 108b, the third portion 108c has a largest length, and has a smaller width in comparison to the second portion 108b. In this way, the parasitic capacitance generated between the contacts 108 in two adjacent rows may be effectively reduced.

In addition, in order to prevent the parasitic capacitance from being generated due to an excessively small distance between the second portions 108b having a larger width in the two adjacent rows, in the present embodiment, the second portions 108b in the two adjacent rows are misaligned with each other. Specifically, as shown in FIG. 1, second portions 108b of the contacts 108 connected to the bit lines 106 in odd rows (a first row, a third row, and a fifth row from top to bottom) are aligned with each other in a column direction (a direction Y in FIG. 1), second portions 108b of the contacts 108 connected to the bit lines 106 in even rows (a second row, a fourth row, and a sixth row from top to bottom) are aligned with each other in the column direction, and the second portions 108b in the odd rows and the second portions 108b in the even rows are misaligned with each other in the column direction. In this way, a distance between the adjacent bit lines 106 may be greatly reduced to effectively reduce a device size, and the parasitic capacitance generated as a result of an excessively small distance between the adjacent second portions 108b may be reduced or even avoided.

However, as shown in FIG. 1, since a distance d1 of the second portion 108b in the odd row to the memory region 100a is different from a distance d2 of the second portion 108b in the even row to the memory region 100a, if the second portions are directly connected to the conductive device 101 in the substrate 100, electric signals received by the conductive device 101 are different due to the foregoing different distances. Therefore, in the present embodiment, the second portion 108b is connected to the conductive device 101 through the third portion 108c, and the third portions 108c of each contact 108 are aligned with each other in the column direction, so that distances between these third portions 108c and the memory region 100a are the same.

As shown in FIG. 1, for the third portions 108c of each contact 108, the distances between these third portions 108c and the memory region 100a are d3. Each of the third portions 108c is adjacent to other two third portions 108c, and distances between each of the third portions 108c and other third portions 108c are d4, and each of the third portions 108c is adjacent to two second portions 108b, and distances between each of the third portions 108c and the two second portions 108b are d5. In other words, the third portions 108c of each of the contacts 108 are in a same environment, and therefore the conductive device 101 may receive a same electric signal via these third portions 108c.

In addition, in the present embodiment, the distances between the third portions 108c of these contacts 108 and the memory region 100a are the same, and the third portions 108c of the contacts 108 are aligned with each other in the column direction (that is, the third portions 108c are located at the same horizontal height), but the invention is not limited thereto. In other embodiments, these third portions 108c may be located at different horizontal heights. For example, the third portions 108c in the odd rows and the third portions 108c in the even rows are respectively located at different horizontal heights, as long as the distances between the third portions 108c of these contacts 108 and the memory region 100a are the same.

Based on the above, in the present embodiment, the contacts 108 may have a low resistance value, and relatively small (or even non-existent) parasitic capacitance may be included between the contacts 108 in two adjacent rows. In addition, the third portions 108c of each contact 108 are in a same environment, and therefore the conductive device 101 may receive a same electric signal from the memory region 100a via these third portions 108c.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A memory structure, comprising:
a substrate comprising a memory region and a peripheral region;
a capacitor array disposed on the substrate in the memory region;
a transistor array disposed on the capacitor array and electrically connected to the capacitor array;
a plurality of bit lines extended along a row direction in parallel with each other on the transistor array and electrically connected to the transistor array; and
a plurality of contacts, each of the contacts being connected to one of the plurality of bit lines and a conductive device at the substrate in the peripheral region, wherein
each of the contacts comprises a first portion, a second portion, and a third portions,
the second portion being disposed between the first portion and the third portion, and the third portion being electrically connected to the conductive device,
distances between each of the third portions and the memory region being the same, and
the second portions of the contacts connected to the bit lines in an odd row are aligned with each other in a column direction interlaced with the row direction, second portions of the contacts connected to the bit lines in an even row are aligned with each other in the column direction, and the second portions in the odd row and the second portions in the even row are misaligned with each other in the column direction.

2. The memory structure according to claim 1, wherein the plurality of bit lines are extended into the peripheral region.

3. The memory structure according to claim 1, wherein distances between the second portions of the contacts connected to the bit lines in an odd row and the memory region are the same.

4. The memory structure according to claim 1, wherein distances between the second portions of the contacts connected to the bit lines in an even row and the memory region are the same.

5. The memory structure according to claim 1, wherein the third portions of each of the contacts are aligned with each other in a column direction interlaced with the row direction.

6. The memory structure according to claim 1, wherein in a top view, a projection area of the second portion on the substrate is greater than a projection area of the third portion on the substrate.

7. The memory structure according to claim 1, wherein in a top view, a projection area of the first portion on the substrate is less than a projection area of the second portion on the substrate.

8. The memory structure according to claim 1, wherein in a top view, a projection area of the first portion on the substrate is less than a projection area of the third portion on the substrate.

9. The memory structure according to claim 1, wherein the conductive device comprises a sense amplifier.

* * * * *